(12) United States Patent  
Huang

(10) Patent No.: US 11,621,718 B2  
(45) Date of Patent: Apr. 4, 2023

(54) ANALOG-TO-DIGITAL CONVERTER SYSTEM USING REFERENCE ANALOG-TO-DIGITAL CONVERTER WITH SAMPLING POINT SHIFTING AND ASSOCIATED CALIBRATION METHOD

(71) Applicant: MediaTek Singapore Pte. Ltd., Singapore (SG)

(72) Inventor: Sheng-Jui Huang, San Jose, CA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/381,212

(22) Filed: Jul. 21, 2021

(65) Prior Publication Data

US 2022/0131549 A1 Apr. 28, 2022

Related U.S. Application Data

(60) Provisional application No. 63/106,416, filed on Oct. 28, 2020.

(51) Int. Cl.
*H03M 1/10* (2006.01)
*H03M 1/12* (2006.01)

(52) U.S. Cl.
CPC ....... *H03M 1/1245* (2013.01); *H03M 1/1009* (2013.01)

(58) Field of Classification Search
CPC .......................... H03M 1/1245; H03M 1/1009
USPC .................................. 341/120, 155, 159, 118
See application file for complete search history.

(56) References Cited

U.S. PATENT DOCUMENTS

| 2007/0069937 A1* | 3/2007 | Balakrishnan | H03M 1/0624 |
| | | | 341/161 |
| 2016/0182075 A1 | 6/2016 | Devarajan | |
| 2019/0222220 A1* | 7/2019 | Ryu | H03M 1/1215 |

OTHER PUBLICATIONS

Buchwald, A Supposedly Clever Thing I'll Never Do Again, 2017 IEEE Custom Integrated Circuits Conference (CICC).
Guo, A 10b 1.6GS/s 12.2mW 7/8-way Split Time-interleaved SAR ADC with Digital Background Mismatch Calibration, 2019 IEEE Custom Integrated Circuits Conference (CICC).
Kang, A Time-Interleaved 12-b 270-MS/s SAR ADC With Virtual-Timing-Reference Timing-Skew Calibration Scheme, pp. 1-11, IEEE Journal of Solid-State Circuits, 2018.

(Continued)

*Primary Examiner* — Peguy Jean Pierre
(74) *Attorney, Agent, or Firm* — Winston Hsu

(57) ABSTRACT

An analog-to-digital converter (ADC) system includes a main ADC, a reference ADC, a sampling control circuit, and a calibration circuit. The main ADC obtains a first sampled input voltage by sampling an analog input according to a first sampling clock, and performs analog-to-digital conversion upon the first sampled voltage to generate a first sample value. The reference ADC obtains a second sampled voltage by sampling the analog input according to a second sampling clock, and performs analog-to-digital conversion upon the second sampled voltage to generate a second sample value. The sampling control circuit controls the second sampling clock to ensure that the second sampling clock and the first sampling clock have a same frequency but different phases, and adjusts the second sample value to generate a reference sample value. The calibration circuit applies calibration to the main ADC according to the first sample value and the reference sample value.

18 Claims, 3 Drawing Sheets

(56) References Cited

OTHER PUBLICATIONS

Xiao Wang et al., A 14-Bit 500-MS/s Time-Interleaved ADC With Autocorrelation-Based Time Skew Calibration, IEEE Transactions pn Circuits and Systems—II: Express Briefs, vol. 66, No. 3, Mar. 2019, p. 322-326, XP011712369.

* cited by examiner

ANALOG-TO-DIGITAL CONVERTER SYSTEM USING REFERENCE ANALOG-TO-DIGITAL CONVERTER WITH SAMPLING POINT SHIFTING AND ASSOCIATED CALIBRATION METHOD

CROSS REFERENCE TO RELATED APPLICATIONS

This application claims the benefit of U.S. provisional application No. 63/106,416, filed on Oct. 28, 2020 and incorporated herein by reference.

BACKGROUND

The present invention relates to analog-to-digital conversion, and more particularly, to an analog-to-digital converter (ADC) system using a reference ADC with sampling point shifting and an associated calibration method.

Since analog-to-digital converters (ADCs) ultimately limit the performance of today's systems, high-speed and high-resolution ADCs are required. One possibility to overcome these performance limits is to use parallelism. For example, a time-interleaved ADC may be employed to meet the high-speed and high-resolution requirements. However, the time-interleaved ADC may suffer from offset, gain, and timing mismatches between sub-DACs of different channels. One conventional timing-skew calibration design may use a reference ADC. However, the sampling timing of the reference ADC needs to align with that of a sub-DAC to be calibrated, which leads to some side effects. For example, the reference ADC will pull or disturb the sampling network and cause some spurs. Thus, there is a need for a novel ADC calibration method and associated ADC system that are capable of achieving a reference ADC based timing-skew calibration without introducing any side effect or in a way that is less likely to introduce a side effect.

SUMMARY

One of the objectives of the claimed invention is to provide an analog-to-digital converter (ADC) system using a reference ADC with sampling point shifting and an associated calibration method.

According to a first aspect of the present invention, an exemplary analog-to-digital converter (ADC) system is disclosed. The ADC system includes a main ADC, a reference ADC, a sampling control circuit, and a calibration circuit. The main ADC is arranged to obtain a first sampled input voltage by sampling an analog input according to a first sampling clock, and perform analog-to-digital conversion upon the first sampled voltage to generate a first sample value. The reference ADC is arranged to obtain a second sampled voltage by sampling the analog input according to a second sampling clock, and perform analog-to-digital conversion upon the second sampled voltage to generate a second sample value. The sampling control circuit is arranged to control the second sampling clock to ensure that the second sampling clock and the first sampling clock have a same frequency but different phases, and further arranged to adjust the second sample value to generate a reference sample value. The calibration circuit is arranged to apply calibration to the main ADC according to the first sample value and the reference sample value.

According to a second aspect of the present invention, an exemplary analog-to-digital converter (ADC) calibration method is disclosed. The exemplary ADC calibration method includes: performing, by a main ADC, analog-to-digital conversion upon a first sampled voltage to generate a first sample value, wherein the first sampled input voltage is obtained by sampling an analog input according to a first sampling clock of the main ADC; performing, by a reference ADC, analog-to-digital conversion upon a second sampled voltage to generate a second sample value, wherein the second sampled voltage is obtained by sampling the analog input according to a second sampling clock of the reference ADC; controlling the second sampling clock to ensure that the second sampling clock and the first sampling clock have a same frequency but different phases; adjusting the second sample value to generate a reference sample value; and applying calibration to the main ADC according to the first sample value and the reference sample value.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
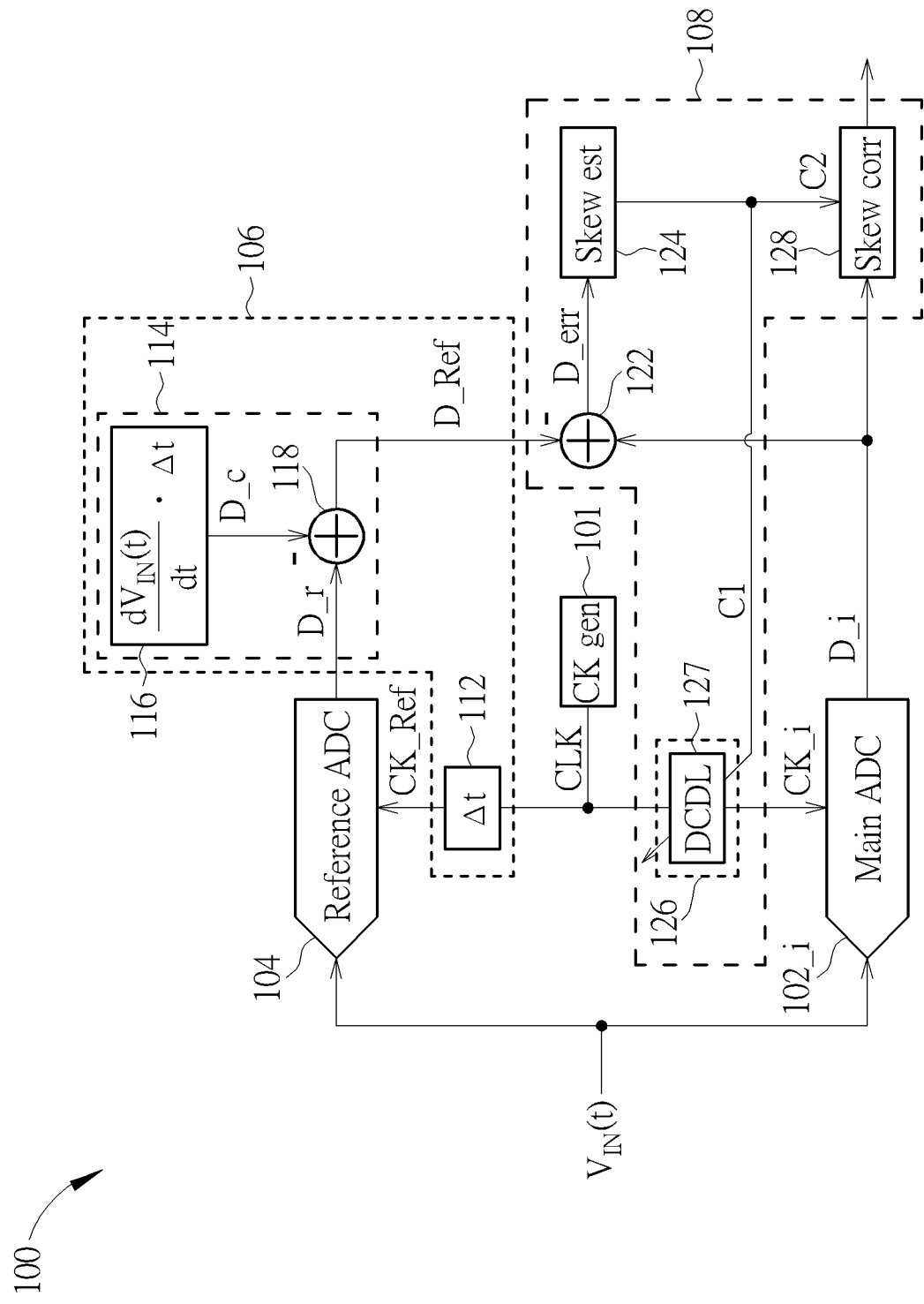
FIG. 1 is a diagram illustrating an analog-to-digital converter (ADC) system according to an embodiment of the present invention.

FIG. 1 is a diagram illustrating an analog-to-digital converter (ADC) system according to an embodiment of the present invention. The ADC system 100 includes at least one main ADC 102_i, a reference ADC 104, a sampling control circuit 106, and a calibration circuit 108. The ADC system 100 converts an analog input $V_{IN}(t)$ into a digital output, and transmits the digital output to a following stage for further processing. The digital output derived from analog-to-digital conversion of the analog input $V_{IN}(t)$ depends on a digital output of the main ADC 102_i. A digital output of the reference ADC 104, however, is used by calibration (e.g., timing-skew calibration) of the main ADC 102_i. In other words, the digital output of the reference ADC 104 is not involved in setting the digital output which is a digital representation of the analog input $V_{IN}(t)$. In this embodiment, the reference ADC 104 operates according to one sampling clock CK_Ref, and the main ADC 102_i operates according to another sampling clock CK_i. In contrast to aligning sampling timing of the main ADC 102_i with that of the reference ADC 104, the present invention proposes using the sampling control circuit 108 to apply sampling point shifting to the reference ADC 104 to ensure that the sampling clocks CK_i and CK_Ref have the same frequency but different phases. More specifically, the phase of the sampling clock CK_Ref is intentionally controlled to deviate from the phase of the sampling clock CK_i, such that a rising edge of the sampling clock CK_Ref is not aligned with a rising edge of the sampling clock CK_i, and a falling edge of the sampling clock CK_Ref is not aligned with a falling edge of the sampling clock CK_i. To put it simply, the sampling control circuit 108 can ensure that the reference ADC 104 and the main ADC 102_i have the same sampling rate but different sampling timing.

The digital output of the reference ADC 104 includes a plurality of sample values D_r, each generated from applying analog-to-digital conversion to one sampled input voltage obtained by sampling the analog input $V_{IN}(t)$ according to the sampling clock CK_Ref. For example, one sampled input voltage is obtained and converted by the reference ADC 104 at each rising edge of the sampling clock CK_Ref. Similarly, the digital output of the main ADC 102_i includes a plurality of sample values D_i, each generated from applying analog-to-digital conversion to one sampled input voltage obtained by sampling the same analog input $V_{IN}(t)$ according to the sampling clock CK_i. For example, one sampled input voltage is obtained and converted by the main ADC 102_i at each rising edge of the sampling clock CK_i.

Since the sampling timing of the reference ADC 104 is intentionally shifted to be misaligned with the sampling timing of the main ADC 102_i, the reference ADC 104 does not pull or disturb the sampling operation performed at the main ADC 102_i. However, since the sampling timing of the reference ADC 104 is deviated, sample value compensation is needed to compensate for a sample value offset resulting from the sampling point shifting. For example, the reference ADC 104 performs a sampling operation a little bit later than the main ADC 102_i, but still measures the same data as the main ADC 102_i.

In this embodiment, the sampling control circuit 108 is arranged to control the sampling clock CK_Ref to ensure that the sampling clocks CK_Ref and CK_i have the same frequency but different phases, and is further arranged to adjust each sample value D_r included in the digital output of the reference ADC 104 to generate a corresponding reference sample value D_Ref actually used by calibration (e.g., timing-skew calibration) of the main ADC 102_i. As shown in FIG. 1, the sampling control circuit 108 may include a delay circuit 112 for adding an offset on an analog side and a compensation circuit 114 for adding an offset on a digital side. The delay circuit 112 is arranged to generate the sampling clock CK_Ref by applying a delay amount Δt to a reference clock CLK for sampling point shifting. For example, the reference clock CLK may be provided by a clock generator (labeled as "CK gen") 101. In this embodiment, the delay amount Δt may be a fixed value, such that there is a fixed phase delay between the sampling clock CK_Ref and the reference clock CLK. In this embodiment, the sampling clock CK_i used by the main ADC 102_i is also derived from the reference clock CLK. With a proper setting of the delay amount Δt, the sampling operation performed at the main ADC 102_i is not interfered with the sampling operation performed at the reference ADC 104. In this way, there is no pulling or disturbance introduced by the reference ADC 104 at the time the main ADC 102_i performs a sampling operation.

The compensation circuit 114 is arranged to determine a compensation value D_c, and generate the reference sample value D_Ref by combining the compensation value D_c and the sample value D_r to compensate for a sample value offset resulting from the sampling point shifting. For example, a differentiator-based circuit 116 multiplies a derivative of the analog input $$\frac{dV_{IN}(t)}{dt}$$

and the delay amount Δt to estimate the compensation value D_c (i.e., $$D\_c = \frac{dV_{IN}(t)}{dt} \cdot \Delta t),$$

and a subtractor circuit 118 (which may be implemented by an adder configured for performing subtraction) subtracts the compensation value D_c from the sample value D_r to generate the reference sample value D_Ref (i.e., $$D\_Ref = D\_r - D\_c = D\_r - \frac{dV_{IN}(t)}{dt} \cdot \Delta t).$$

Figure 2:
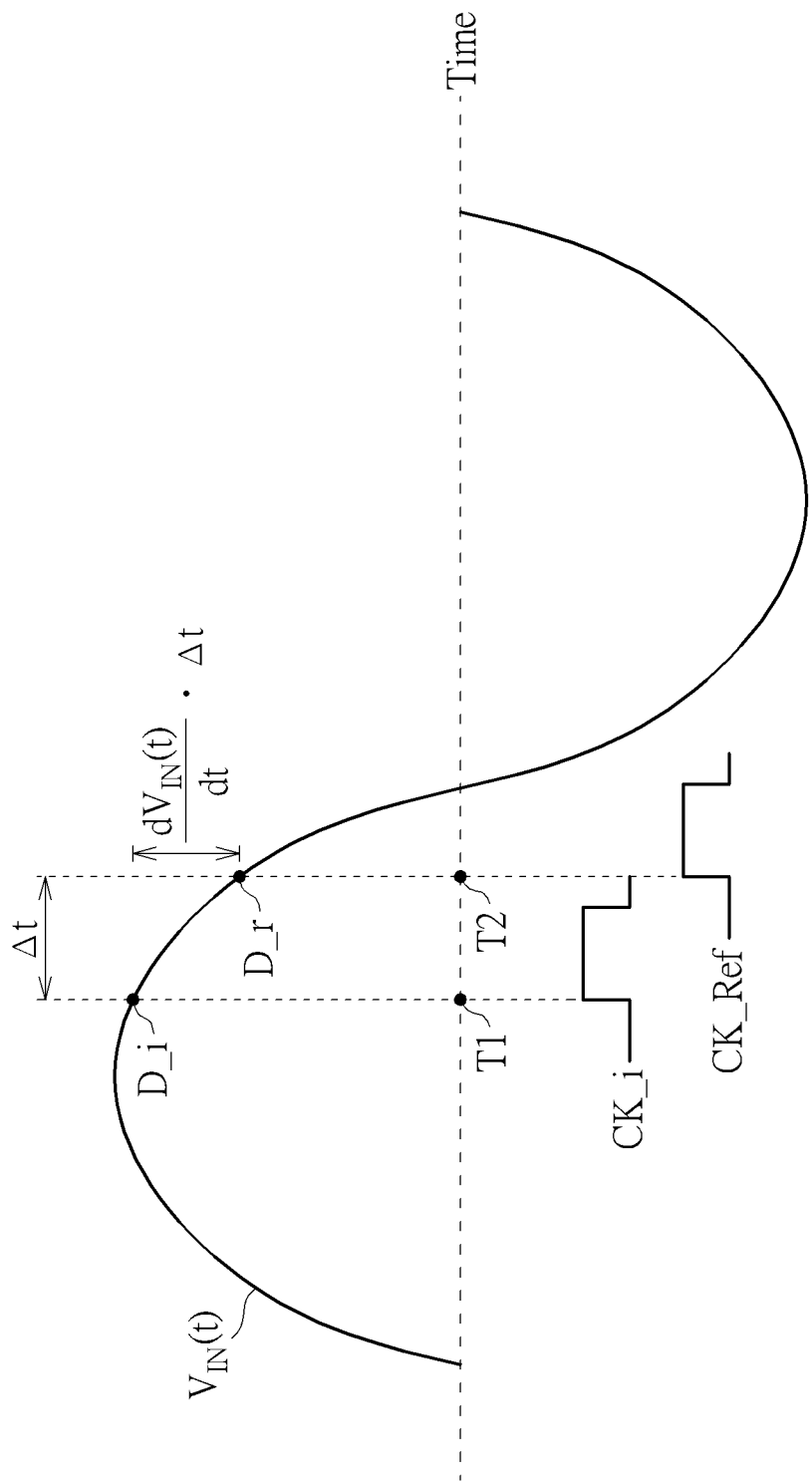
FIG. 2 is a diagram illustrating a concept of calibrating a main ADC by using a reference ADC with proposed sampling point shifting according to an embodiment of the present invention.

The calibration circuit 108 is arranged to apply calibration (e.g., timing-skew calibration) to the main ADC 102_i according to the sample value D_i and the reference sample value D_Ref. FIG. 2 is a diagram illustrating a concept of calibrating a main ADC by using a reference ADC with proposed sampling point shifting according to an embodiment of the present invention. The sample value D_i is obtained at a time instant T1 defined by the sampling clock CK_i. After the delay amount Δt elapses since the main DAC 102_i performs the sampling operation at the time instant T1, the sample value D_r is obtained at the time instant T2 (T2=T1+Δt) defined by the sampling clock CK_Ref. The sign of the derivative of the analog input $$\frac{dV_{IN}(t)}{dt}$$

determines how a sample value generated from the reference ADC 104 is compensated. For example, if the derivative of the analog input $$\frac{dV_{IN}(t)}{dt}$$

is positive, the reference sample value D_Ref is smaller than the sample value D_r. For another example, if the derivative of the analog input $$\frac{dV_{IN}(t)}{dt}$$

is negative, the reference sample value D_Ref is larger than the sample value D_r. In this example shown in FIG. 2, the derivative of the analog input $$\frac{dV_{IN}(t)}{dt}$$

at the time instant T2 is negative. Hence, the reference sample value D_Ref is larger than the sample value D_r due to sample value offset compensation (i.e., $$D\_Ref = D\_r - \frac{dV_{IN}(t)}{dt} \cdot \Delta t).$$

The calibration circuit 108 checks if the sample value D_i matches the reference sample value D_Ref. If the sample value D_i matches the reference sample value D_Ref, it implies that sampling timing of the sampling clock CK_i is aligned with the reference timing, and the main ADC 102_i does not need timing-skew calibration. If the sample value D_i does not match the reference sample value D_Ref, it implies that sampling timing of the sampling clock CK_i is deviated from the reference timing, and the main ADC 102_i needs timing-skew calibration.

For example, regarding calibration (e.g., timing-skew calibration) of the main ADC 102_i, an offset may be added to an analog side and/or an offset may be added to a digital side. In this embodiment, the calibration circuit 108 may employ a hybrid solution that is different from an all digital solution and an all analog solution. As shown in FIG. 1, the calibration circuit 108 may include a subtractor circuit (which may be implemented by an adder configured for performing subtraction) 122, a skew estimation circuit (labeled as "Skew est") 124, one skew correction circuit 126 for analog-side correction, and another skew correction circuit (labeled as "Skew corr") 128 for digital-side correction. The subtractor circuit 122 is arranged to calculate an error D_err between the sample value D_i and the reference sample value D_Ref. The skew estimation circuit 124 is arranged to estimate a timing skew according to the error D_err, and generate two control signals C1 and C2 according to the estimated timing skew. Since digital correction of the digital output that is performed at the skew correction circuit 128 has a limited coverage range, the proposed hybrid solution further uses the skew correction circuit 126 to provide analog correction for the sampling clock CK_i. The skew correction circuit 126 is arranged to adjust a phase of the sampling clock CK_i according to the control signal C1. In this embodiment, the skew correction circuit 126 may include a digitally controlled delay line (DCDL) 127 arranged to generate the sampling clock CK_i by applying an adjustable delay amount to the reference clock REF provided by the clock generator 101, where the adjustable delay amount is set by the control signal C1. The skew correction circuit 128 is arranged to adjust a digital output of the main ADC 102_i according to the control signal C2. To put it simply, calibration (e.g., timing-skew calibration) of the main DAC 102_i is achieved by jointly using the digital correction and the analog correction to reduce or cancel the error D_err between the sample value D_i and the reference sample value D_Ref. In this way, a final digital output generated from the skew correction circuit 128 may be regarded as a digital output generated by the main ADC 102_i under the sampling timing aligned with the reference timing.

Figure 3:
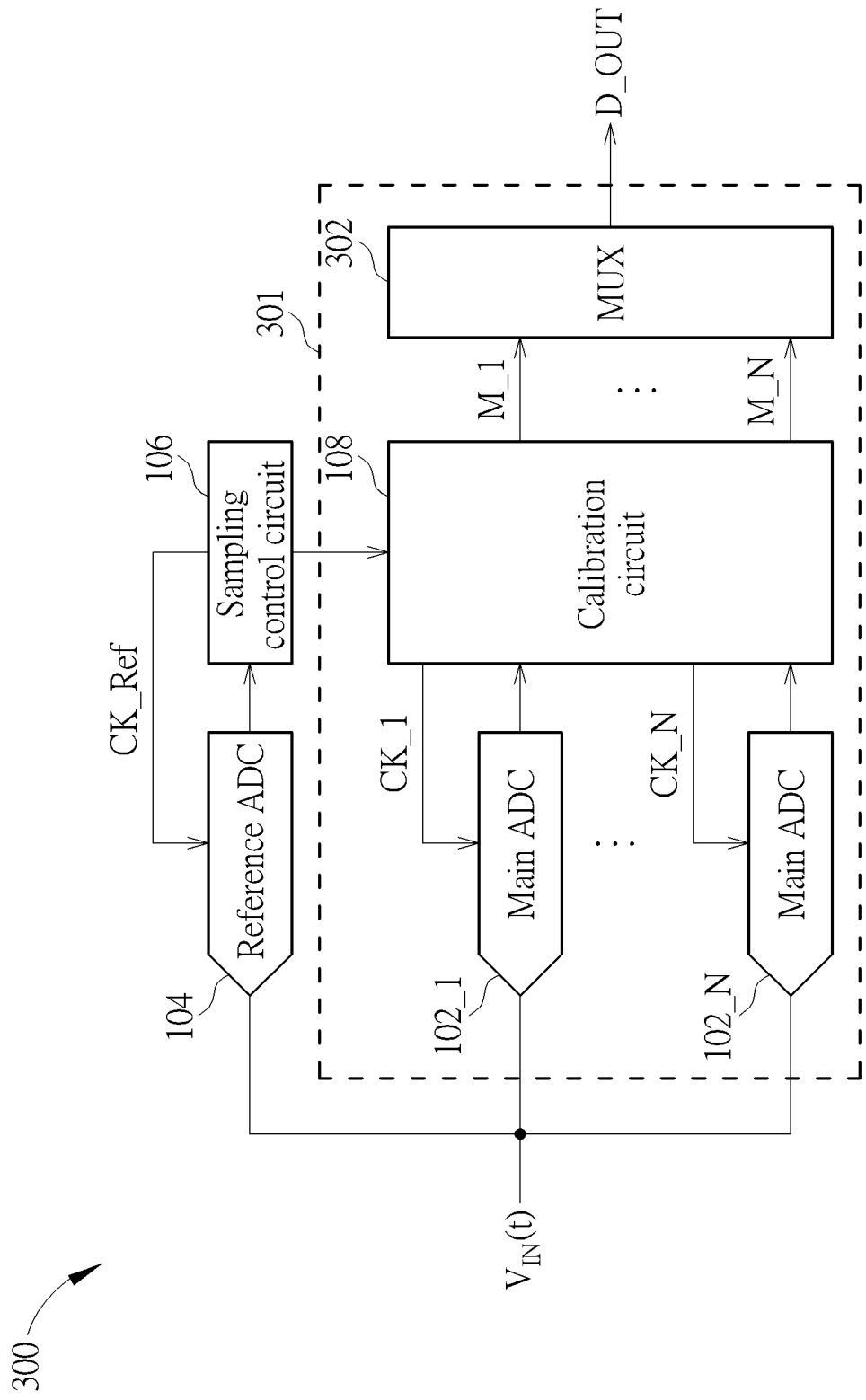
FIG. 3 is a diagram illustrating another ADC system according to an embodiment of the present invention.

The same concept of calibrating a main ADC by using a reference ADC with proposed sampling point shifting may be extended to calibrating multiple main ADCs by using a single reference ADC with proposed sampling point shifting. FIG. 3 is a diagram illustrating another ADC system according to an embodiment of the present invention. The ADC system 300 includes a plurality of main ADCs 102_1-102_N (N≥2), a multiplexer (labeled as "MUX") 302, and the aforementioned reference ADC 104, sampling control circuit 106, and calibration circuit 108. In this embodiment, the reference ADC 104 is used to calibrate a time-interleaved ADC 301 using the main ADCs 102_1-102_N, where multiplexer inputs M_1-M_N derived from digital outputs of the main ADCs 102_1-102_N are combined by the multiplexer 302 to form a digital output D OUT of the time-interleaved ADC 301. The main ADC 102_i shown in FIG. 1 may be any of the main ADCs 102_1-102_N (i=1, . . . , N). In this embodiment, the same reference ADC 104 can be used to calibrate all of the main ADCs 102_1-102_N. It should be noted that the sampling control circuit 106 controls the sampling clock CK_Ref to ensure that the sampling clock CK_Ref used by the reference ADC 104 and each of the sampling clocks CK_1-CK_N used by the main ADCs 102_1-102_N have the same frequency but different phases, thereby achieving the sampling point shifting of the reference ADC 104 to prevent sampling operations of the main ADCs 102_1-102_N from being affected by the sampling operation of the reference ADC 104. In addition, the digital output of the reference ADC 104 is properly adjusted to compensate for the sample value offset resulting from the sampling point shifting, thereby enabling the calibration (e.g., timing-skew calibration) of the main ADCs 102_1-102_N to work as desired.

Compared to splitting a reference ADC into multiple reference ADCs for calibration (e.g., timing-skew calibration) of the main ADCs 102_1-102_N, using the single reference ADC 104 to calibrate all of the main ADCs 102_1-102_N has lower area penalty. Furthermore, compared to using resistor-capacitor (RC) networks to delay the analog input and the sampling clock of a reference ADC, using the sampling control circuit 106 to delay the sampling clock of a reference ADC and apply compensation to a digital output of the reference ADC has better cost efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An analog-to-digital converter (ADC) system, comprising:
 a main ADC, arranged to obtain a first sampled input voltage by sampling an analog input according to a first sampling clock, and perform analog-to-digital conversion upon the first sampled voltage to generate a first sample value;
 a reference ADC, arranged to obtain a second sampled voltage by sampling the analog input according to a second sampling clock, and perform analog-to-digital conversion upon the second sampled voltage to generate a second sample value;

a sampling control circuit, arranged to control the second sampling clock to apply sampling point shifting to the reference ADC for ensuring that the second sampling clock and the first sampling clock have a same frequency but different phases, and further arranged to compensate for a sample value offset resulting from the sampling point shifting by adjusting the second sample value in a digital domain, to generate a reference sample value, wherein the sample value offset is a deviation of a sample value obtained by the reference ADC at a time instant defined by the second sampling clock from a sample value obtained by the main ADC at a time instant defined by the first sampling clock, and the deviation is caused by the sampling point shifting; and a calibration circuit, arranged to apply calibration to the main ADC according to the first sample value and the reference sample value.

2. The ADC system of claim 1, wherein the ADC system comprises a plurality of main ADCs, the main ADC is any of the plurality of main ADCs, and the reference ADC is used to calibrate all of the plurality of main ADCs.

3. The ADC system of claim 2, wherein the ADC system comprises a time-interleaved ADC using the plurality of main ADCs.

4. An analog-to-digital converter (ADC) system, comprising:

a main ADC, arranged to obtain a first sampled input voltage by sampling an analog input according to a first sampling clock, and perform analog-to-digital conversion upon the first sampled voltage to generate a first sample value;

a reference ADC, arranged to obtain a second sampled voltage by sampling the analog input according to a second sampling clock, and perform analog-to-digital conversion upon the second sampled voltage to generate a second sample value;

a sampling control circuit, arranged to control the second sampling clock to ensure that the second sampling clock and the first sampling clock have a same frequency but different phases, and further arranged to adjust the second sample value to generate a reference sample value; and a calibration circuit, arranged to apply calibration to the main ADC according to the first sample value and the reference sample value;

wherein the sampling control circuit is arranged to generate the second sampling clock according to a reference clock, and the reference clock and the second sampling clock have a same frequency but different phases.

5. The ADC system of claim 4, wherein the sampling control circuit comprises:

a delay circuit, arranged to generate the second sampling clock by applying a delay amount to the reference clock for sampling point shifting.

6. The ADC system of claim 5, wherein the delay amount is a fixed value.

7. The ADC system of claim 5, wherein the sampling control circuit further comprises:

a compensation circuit, arranged to determine a compensation value, and generate the reference sample value by combining the compensation value and the second sample value to compensate for a sample value offset resulting from the sampling point shifting.

8. An analog-to-digital converter (ADC) system, comprising:

a main ADC, arranged to obtain a first sampled input voltage by sampling an analog input according to a first sampling clock, and perform analog-to-digital conversion upon the first sampled voltage to generate a first sample value;

a reference ADC, arranged to obtain a second sampled voltage by sampling the analog input according to a second sampling clock, and perform analog-to-digital conversion upon the second sampled voltage to generate a second sample value;

a sampling control circuit, arranged to control the second sampling clock to ensure that the second sampling clock and the first sampling clock have a same frequency but different phases, and further arranged to adjust the second sample value to generate a reference sample value; and a calibration circuit, arranged to apply calibration to the main ADC according to the first sample value and the reference sample value;

wherein the calibration circuit comprises:

a subtractor circuit, arranged to calculate an error between the first sample value and the reference sample value;

a skew estimation circuit, arranged to estimate a timing skew according to the error, and generate a first control signal and a second control signal according to the timing skew;

a first skew correction circuit, arranged to adjust a phase of the first sampling clock according to the first control signal; and a second skew correction circuit, arranged to adjust a digital output of the main ADC according to the second control signal.

9. The ADC system of claim 8, wherein the first skew correction circuit comprises:

a digitally controlled delay line, arranged to generate the first sampling clock by applying an adjustable delay amount to a reference clock, where the adjustable delay amount is set by the first control signal.

10. An analog-to-digital converter (ADC) calibration method, comprising:

performing, by a main ADC, analog-to-digital conversion upon a first sampled voltage to generate a first sample value, wherein the first sampled input voltage is obtained by sampling an analog input according to a first sampling clock of the main ADC;

performing, by a reference ADC, analog-to-digital conversion upon a second sampled voltage to generate a second sample value, wherein the second sampled voltage is obtained by sampling the analog input according to a second sampling clock of the reference ADC;

controlling the second sampling clock to apply sampling point shifting to the reference ADC for ensuring that the second sampling clock and the first sampling clock have a same frequency but different phases;

compensating for a sample value offset resulting from the sampling point shifting by adjusting the second sample value, to generate a reference sample value, wherein the sample value offset is a deviation of a sample value obtained by the reference ADC at a time instant defined by the second sampling clock from a sample value obtained by the main ADC at a time instant defined by the first sampling clock, and the deviation is caused by the sampling point shifting; and applying calibration to the main ADC according to the first sample value and the reference sample value.

11. The ADC calibration method of claim 10, wherein the main ADC is any of a plurality of main ADCs, and the reference ADC is used to calibrate all of the plurality of main ADCs.

12. The ADC calibration method of claim 11, wherein the plurality of main ADCs are included in a time-interleaved ADC.

13. An analog-to-digital converter (ADC) calibration method, comprising:
   performing, by a main ADC, analog-to-digital conversion upon a first sampled voltage to generate a first sample value, wherein the first sampled input voltage is obtained by sampling an analog input according to a first sampling clock of the main ADC;
   performing, by a reference ADC, analog-to-digital conversion upon a second sampled voltage to generate a second sample value, wherein the second sampled voltage is obtained by sampling the analog input according to a second sampling clock of the reference ADC;
   controlling the second sampling clock to ensure that the second sampling clock and the first sampling clock have a same frequency but different phases;
   adjusting the second sample value to generate a reference sample value; and
   applying calibration to the main ADC according to the first sample value and the reference sample value;
   wherein controlling the second sampling clock to ensure that the second sampling clock and the first sampling clock have a same frequency but different phases comprises:
   generating the second sampling clock according to a reference clock, wherein the reference clock and the second sampling clock have a same frequency but different phases.

14. The ADC calibration method of claim 13, wherein generating the second sampling clock according to the reference clock comprises:
   generating the second sampling clock by applying a delay amount to the reference clock for sampling point shifting.

15. The ADC calibration method of claim 14, wherein the delay amount is a fixed value.

16. The ADC calibration method of claim 14, wherein adjusting the second sample value to generate the reference sample value comprises:
determining a compensation value; and
generating the reference sample value by combining the compensation value and the second sample value to compensate for a sample value offset resulting from the sampling point shifting.

17. An analog-to-digital converter (ADC) calibration method, comprising:
   performing, by a main ADC, analog-to-digital conversion upon a first sampled voltage to generate a first sample value, wherein the first sampled input voltage is obtained by sampling an analog input according to a first sampling clock of the main ADC;
   performing, by a reference ADC, analog-to-digital conversion upon a second sampled voltage to generate a second sample value, wherein the second sampled voltage is obtained by sampling the analog input according to a second sampling clock of the reference ADC;
   controlling the second sampling clock to ensure that the second sampling clock and the first sampling clock have a same frequency but different phases;
   adjusting the second sample value to generate a reference sample value; and
   applying calibration to the main ADC according to the first sample value and the reference sample value;
   wherein applying calibration to the main ADC according to the first sample value and the reference sample value comprises:
   calculating an error between the first sample value and the reference sample value;
   estimating a timing skew according to the error;
   generating a first control signal and a second control signal according to the timing skew;
   adjusting a phase of the first sampling clock according to the first control signal; and
   adjusting a digital output of the main ADC according to the second control signal.

18. The ADC calibration method of claim 17, wherein adjusting the phase of the first sampling clock according to the first control signal comprises:
   applying, by a digitally controlled delay line, an adjustable delay amount to a reference clock for generating the first sampling clock, wherein the adjustable delay amount is set by the first control signal.

* * * * *